(12) United States Patent
Kimura et al.

(10) Patent No.: US 9,153,755 B2
(45) Date of Patent: Oct. 6, 2015

(54) SILICONE RESIN SHEET, CURED SHEET, AND LIGHT EMITTING DIODE DEVICE AND PRODUCING METHOD THEREOF

(71) Applicants: Ryuichi Kimura, Ibaraki (JP); Hiroyuki Katayama, Ibaraki (JP)

(72) Inventors: Ryuichi Kimura, Ibaraki (JP); Hiroyuki Katayama, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/650,837

(22) Filed: Oct. 12, 2012

(65) Prior Publication Data
US 2013/0092974 A1    Apr. 18, 2013

(30) Foreign Application Priority Data

Oct. 18, 2011 (JP) ................................. 2011-228921
Dec. 28, 2011 (JP) ................................. 2011-288200

(51) Int. Cl.
| | |
|---|---|
| H01L 23/28 | (2006.01) |
| H01L 33/56 | (2010.01) |
| C08J 5/18 | (2006.01) |
| C08L 83/04 | (2006.01) |
| H01L 33/54 | (2010.01) |
| C08G 77/04 | (2006.01) |

(Continued)

(52) U.S. Cl.
CPC . *H01L 33/56* (2013.01); *C08J 5/18* (2013.01); *C08L 83/04* (2013.01); *C08G 77/045* (2013.01); *C08G 77/12* (2013.01); *C08G 77/14* (2013.01); *C08G 77/16* (2013.01); *C08G 77/20* (2013.01); *C08J 2383/04* (2013.01); *C08K 5/5425* (2013.01); *C08K 5/5435* (2013.01); *H01L 33/54* (2013.01); *H01L 2224/48091* (2013.01); *H01L 2933/005* (2013.01)

(58) Field of Classification Search
CPC ................................. H01L 23/28; G03G 9/087
USPC ................. 430/109, 111.4, 124, 126, 137.14, 430/108.5; 257/98, E21.502, 787, 788, 793, 257/667, E33.061; 438/26, 780
See application file for complete search history.

(56) References Cited

U.S. PATENT DOCUMENTS

| | | | | |
|---|---|---|---|---|
| 5,126,826 A | * | 6/1992 | Kauchi et al. | .................. 257/461 |
| 2001/0046636 A1 | * | 11/2001 | Daimon et al. | ............ 430/109.4 |

(Continued)

FOREIGN PATENT DOCUMENTS

| | | |
|---|---|---|
| EP | 2 374 847 A1 | 10/2011 |
| JP | 2008-230114 | 10/2008 |

(Continued)

OTHER PUBLICATIONS

Extended European Search Report dated Jan. 23, 2014, issued by the European Patent Office in corresponding European Application No. 12188652.7.

(Continued)

*Primary Examiner* — David Vu
*Assistant Examiner* — Mouloucoulaye Inoussa
(74) *Attorney, Agent, or Firm* — Sughrue Mion, PLLC

(57) ABSTRACT

A silicone resin sheet is formed from a resin composition containing a thermosetting silicone resin and microparticles. The complex viscosity thereof at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C.; a rate of frequency increase of 10 Hz/min; and a distortion of 1% in a shear mode.

6 Claims, 2 Drawing Sheets

(51) Int. Cl.
   *C08G 77/12* (2006.01)
   *C08G 77/14* (2006.01)
   *C08K 5/5425* (2006.01)
   *C08K 5/5435* (2006.01)
   *C08G 77/16* (2006.01)
   *C08G 77/20* (2006.01)

(56) References Cited

U.S. PATENT DOCUMENTS

| | | | |
|---|---|---|---|
| 2005/0006794 | A1 | 1/2005 | Kashiwagi et al. |
| 2010/0225010 | A1 | 9/2010 | Katayama |
| 2011/0079816 | A1 | 4/2011 | Fujioka et al. |
| 2011/0248312 | A1 | 10/2011 | Katayama |

FOREIGN PATENT DOCUMENTS

| | | |
|---|---|---|
| JP | 2009-084511 A | 4/2009 |
| JP | 2010-159411 A | 7/2010 |
| JP | 2010-202801 A | 9/2010 |
| JP | 2010-265436 A | 11/2010 |
| JP | 2010-265437 A | 11/2010 |
| JP | 2010-285593 | 12/2010 |
| JP | 2011-082340 A | 4/2011 |
| JP | 2011-219597 A | 11/2011 |

OTHER PUBLICATIONS

PerkinElmer, Inc., "Introduction to Dynamic Mechanical Analysis (DMA) : A Beginner's Guide", www.perkinelmer.com, Aug. 12, 2011, XP002718380, Retrieved from the internet: URL:http://web.archive.org/web/20110812080031/http://www.perkinelmer.com/CMSResources/Images/44-74546GDE_IntroductionToDMA.pdf [retrieved on Jan. 8, 2014], 24 pages total.

Communication dated Dec. 10, 2014 from the European Patent Office in counterpart application No. 12 188 652.7.

Harry S. Katz, John V. Milewski: "Handbook of fillers for plastics", Dec. 30, 1987, Springer Science & Business Media, 1987, New York, USA, pp. 11-13 and 189.

Notification of Reasons for Refusal dated Apr. 28, 2015 from the Japanese Patent Office in counterpart application No. 2011-288200.

Notification of Reasons for Refusal dated Jun. 23, 2015 issued in corresponding JP Application No.: 2011228921.

\* cited by examiner (a)

(b)

(b)

(c)

(d)

SILICONE RESIN SHEET, CURED SHEET, AND LIGHT EMITTING DIODE DEVICE AND PRODUCING METHOD THEREOF

CROSS-REFERENCE TO RELATED APPLICATION

The present application claims priority from Japanese Patent Application No. 2011-288200 filed on Oct. 18, 2011 and Japanese Patent Application No. 2011-228921 filed on Dec. 28, 2011, the contents of which are hereby incorporated by reference into this application.

BACKGROUND OF THE INVENTION

1. Field of the Invention

The present invention relates to a silicone resin sheet, a cured sheet, and a light emitting diode device and a producing method thereof, to be specific, to a silicone resin sheet, a cured sheet which is obtained by curing the silicone resin sheet, a method for producing a light emitting diode device in which a light emitting diode element is encapsulated by the cured sheet, and a light emitting diode device obtained by the method.

2. Description of Related Art

Conventionally, a light emitting device capable of emitting high-energy light has been known.

The light emitting device includes, for example, a light emitting diode element and an encapsulating material which encapsulates the light emitting diode element.

As the encapsulating material of the light emitting device, for example, an optical semiconductor encapsulating material in a sheet shape which contains a silicone resin and inorganic particles has been proposed (ref: for example, Japanese Unexamined Patent Publication No. 2009-84511).

SUMMARY OF THE INVENTION

However, there is a disadvantage that in a case where the light emitting diode element is connected to a board by a wire bonding method using a wire, the wire may be deformed or the handling of an optical semiconductor encapsulating sheet may become difficult when an LED element is encapsulated using the optical semiconductor encapsulating sheet in Japanese Unexamined Patent Publication No. 2009-84511.

It is an object of the present invention to provide a silicone resin sheet which has an excellent handling ability and is capable of embedding a light emitting diode element, while preventing a damage of the light emitting diode element and a member disposed close thereto, a cured sheet, and a light emitting diode device and a method for producing the light emitting diode device.

A silicone resin sheet of the present invention is formed from a resin composition containing a thermosetting silicone resin and microparticles, and the complex viscosity thereof at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C.; a rate of frequency increase of 10 Hz/min; and a distortion of 1% in a shear mode.

In the silicone resin sheet of the present invention, it is preferable that the microparticles are silica microparticles and/or silicone microparticles.

A cured sheet of the present invention is obtained by cuing the above-described silicone resin sheet.

A light emitting diode device of the present invention includes a light emitting diode element and the above-described cured sheet which encapsulates the light emitting diode element.

A method for producing a light emitting diode device of the present invention includes the steps of embedding a light emitting diode element by the above-described silicone resin sheet and encapsulating the light emitting diode element by curing the silicone resin sheet.

In the method for producing a light emitting diode device of the present invention, the silicone resin sheet of the present invention having the complex viscosity at a frequency of 10 Hz at 30° C. of 80 to 1000 Pa·s and having the tan δ at a frequency of 10 Hz at 30° C. of 0.3 to 1.6 is used, so that the silicone resin sheet has an excellent handling ability and is capable of embedding the light emitting diode element, while preventing a damage of the light emitting diode element and a member disposed close thereto.

The light emitting diode element is encapsulated by the cured sheet of the present invention obtained by curing the silicone resin sheet, so that the light emitting diode device of the present invention having an excellent reliability can be obtained.

DETAILED DESCRIPTION OF THE INVENTION

Figure 1:
FIG. 1 shows process drawings for illustrating the steps of producing one embodiment of a silicone resin sheet of the present invention:
  (a) illustrating a step of preparing a release sheet and
  (b) illustrating a step of laminating an encapsulating resin layer.
Figure 1:
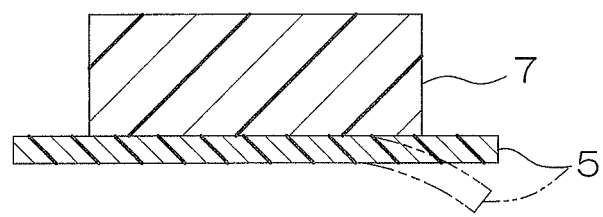
Figure 2A:
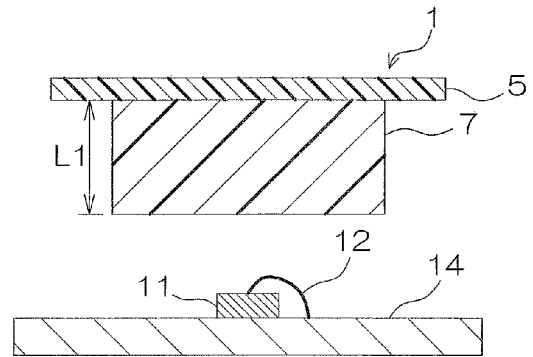
FIG. 2 shows process drawings for illustrating the steps of embedding a light emitting diode element by the silicone resin sheet shown in FIG. 1 to fabricate a light emitting diode device by encapsulating the light emitting diode element by a cured sheet:
  (a) illustrating a step of disposing a silicone resin sheet at the upper side of a board,
  (b) illustrating a step of embedding the light emitting diode element by the silicone resin sheet,
  (c) illustrating a step of compressively bonding the silicone resin sheet to the board to encapsulate an optical semiconductor element, and
  (d) illustrating a step of heating the silicone resin sheet to be cured.
Figure 2A:
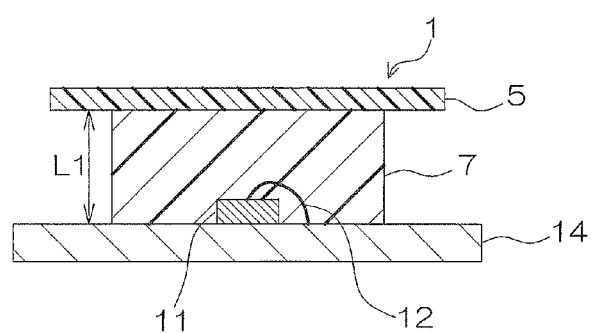
Figure 2A:
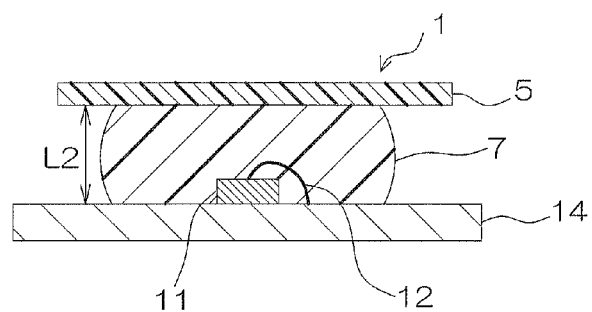
Figure 2A:
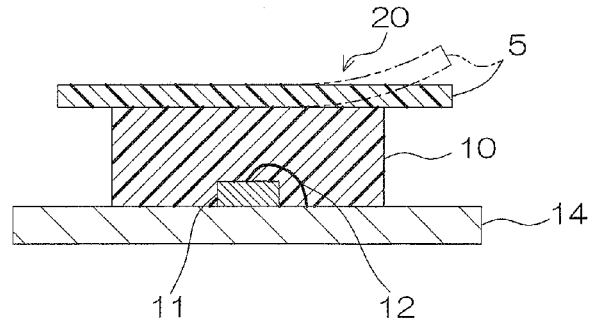

A silicone resin sheet of the present invention is formed from a resin composition containing a thermosetting silicone resin and microparticles.

To be specific, the silicone resin sheet includes, for example, an encapsulating resin layer formed from the resin composition into a generally sheet shape.

An example of the thermosetting silicone resin includes a thermosetting silicone resin composition having two reaction systems (reaction systems in a curing reaction).

An example of the thermosetting silicone resin composition having two reaction systems includes a condensation/addition reaction curable type silicone resin composition having two reaction systems of a condensation reaction and an addition reaction.

To be specific, the condensation/addition reaction curable type silicone resin composition can be brought into a semi-cured state (a B-stage state) by undergoing the condensation reaction (a silanol condensation reaction) by heating and then, be brought into a cured state (a completely cured state) by undergoing the addition reaction (a hydrosilylation addition reaction) by further heating.

Examples of the condensation/addition reaction curable type silicone resin composition include a first thermosetting silicone resin composition which contains a polysiloxane containing silanol groups at both ends, a silicon compound containing an ethylenically unsaturated hydrocarbon group (hereinafter, defined as an ethylenic silicon compound), a silicon compound containing an epoxy group, and an organohydrogensiloxane; a second thermosetting silicone resin composition which contains a first organopolysiloxane having, in one molecule, at least two alkenylsilyl groups, a second organopolysiloxane having, in one molecule, at least two hydrosilyl groups, a hydrosilylation catalyst, and a curing retarder; a third thermosetting silicone resin composition which contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; and a fourth thermosetting silicone resin composition which contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, and a hydrosilylation catalyst.

As the condensation/addition reaction curable type silicone resin composition, preferably, a first thermosetting silicone resin composition is used.

In the first thermosetting silicone resin composition, the polysiloxane containing silanol groups at both ends, the ethylenic silicon compound, and the silicon compound containing an epoxy group are condensation materials (materials subjected to the condensation reaction). The ethylenic silicon compound and the organohydrogensiloxane are addition materials (materials subjected to the addition reaction).

The polylsiloxane containing silanol groups at both ends is an organosiloxane which contains silanol groups (SiOH groups) at both ends of its molecule and to be specific, is represented by the following general formula (1).

General Formula (1):

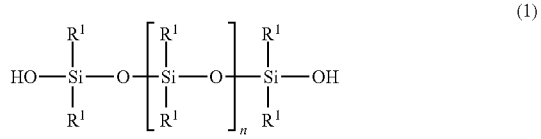

(1)

(where, in general formula (1), $R^1$ represents a monovalent hydrocarbon group selected from a saturated hydrocarbon group and an aromatic hydrocarbon group. "n" represents an integer of 1 or more.)

In the above-described general formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (1), in the monovalent hydrocarbon group represented by $R^1$, an example of the aromatic hydrocarbon group includes an aryl group having 6 to 10 carbon atoms (such as a phenyl group and a naphthyl group).

In the above-described general formula (1), $R^1$s may be the same or different from each other. Preferably, $R^1$s are the same.

As the monovalent hydrocarbon group, preferably, an alkyl group having 1 to 6 carbon atoms and an aryl group having 6 to 10 carbon atoms are used, or more preferably, in view of transparency, thermal stability, and light resistance, a methyl group is used.

In the above-described general formula (1), "n" is preferably, in view of stability and/or handling ability, an integer of 1 to 10000, or more preferably an integer of 1 to 1000.

"n" in the above-described general formula (1) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

The polysiloxanes containing silanol groups at both ends can be used alone or in combination.

Of the polysiloxanes containing silanol groups at both ends, preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The number average molecular weight of the polysiloxane containing silanol groups at both ends is, for example, in view of stability and/or handling ability, 100 to 1000000, or preferably 200 to 100000. The number average molecular weight is calculated by conversion based on standard polystyrene with a gel permeation chromatography. The number average molecular weight of materials, other than the polysiloxane containing silanol groups at both ends, to be described later, is also calculated in the same manner as described above.

The silanol group equivalent in the polysiloxane containing silanol groups at both ends is, for example, 0.002 to 25 mmol/g, or preferably 0.02 to 25 mmol/g.

The mixing ratio of the polysiloxane containing silanol groups at both ends with respect to 100 parts by mass of the condensation material is, for example, 1 to 99.99 parts by mass, preferably 50 to 99.9 parts by mass, or more preferably 80 to 99.5 parts by mass.

The ethylenic silicon compound is a silane compound having both an ethylenically unsaturated hydrocarbon group and a leaving group in a silanol condensation reaction and to be specific, is represented by the following general formula (2).

General Formula (2):

(2)

(where, in general formula (2), $R^2$ represents a monovalent ethylenically unsaturated hydrocarbon group. $X^1$ represents a halogen atom, an alkoxy group, a phenoxy group, or an acetoxy group. $X^1$s may be the same or different from each other.)

In the above-described general formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group, preferably, an alkenyl group is used, more preferably, an alkenyl group having 2 to 5 carbon atoms is used, or particularly preferably, a vinyl group is used.

$X^1$ in the above-described general formula (2) is a leaving group in the silanol condensation reaction. $SiX^1$ group in the above-described general formula (2) is a reactive functional group in the silanol condensation reaction.

In the above-described general formula (2), examples of the halogen atom represented by $X^1$ include bromine, chlorine, fluorine, and iodine.

In the above-described general formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (2), $X^1$s may be the same or different from each other. Preferably, $X^1$s are the same.

Of the $X^1$s in the above-described general formula (2), preferably, an alkoxy group is used, or more preferably, a methoxy group is used.

Examples of the ethylenic silicon compound include a trialkoxysilane containing an ethylenically unsaturated hydrocarbon group, a trihalogenated silane containing an ethylenically unsaturated hydrocarbon group, a triphenoxysilane containing an ethylenically unsaturated hydrocarbon group, and a triacetoxysilane containing an ethylenically unsaturated hydrocarbon group.

The ethylenic silicon compounds can be used alone or in combination.

Of the ethylenic silicon compounds, preferably, a trialkoxysilane containing an ethylenically unsaturated hydrocarbon group is used.

To be specific, examples of the trialkoxysilane containing an ethylenically unsaturated hydrocarbon group include vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; and cyclohexenyltrimethoxysilane.

Of the trialkoxysilanes containing an ethylenically unsaturated hydrocarbon group, preferably, vinyltrialkoxysilane is used, or more preferably, vinyltrimethoxysilane is used.

The mixing ratio of the ethylenic silicon compound with respect to 100 parts by mass of the condensation material is, for example, 0.01 to 90 parts by mass, preferably 0.01 to 50 parts by mass, or more preferably 0.01 to 10 parts by mass.

A commercially available product can be used as the ethylenic silicon compound. An ethylenic silicon compound synthesized in accordance with a known method can be also used.

The silicon compound containing an epoxy group is a silane compound having both an epoxy group and a leaving group in the silanol condensation reaction and to be specific, is represented by the following general formula (3).

General Formula (3):

(where, in general formula (3), $R^3$ represents a group having an epoxy structure. $X^2$ represents a halogen atom, an alkoxy group, a phenoxy group, or an acetoxy group. $X^2$s may be the same or different from each other.)

In the above-described general formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (4).

General Formula (4):

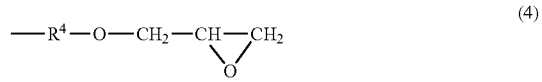

(where, in general formula (4), $R^4$ represents a divalent hydrocarbon group selected from a saturated hydrocarbon group and an aromatic hydrocarbon group.)

In the above-described general formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (3) is a leaving group in the silanol condensation reaction. $SiX^2$ group in the above-described general formula (3) is a reactive functional group in the silanol condensation reaction.

In the above-described general formula (3), an example of the halogen atom represented by $X^2$ includes the same halogen atom as that represented by $X^1$ in the above-described general formula (2).

In the above-described general formula (3), an example of the alkoxy group represented by $X^2$ includes the same alkoxy group as that represented by $X^1$ in the above-described general formula (2).

In the above-described general formula (3), $X^2$s may be the same or different from each other. Preferably, $X^2$s are the same.

As $X^2$ in the above-described general formula (3), preferably, an alkoxy group is used, or more preferably, a methoxy group is used.

Examples of the silicon compound containing an epoxy group include a trialkoxysilane containing an epoxy group, a trihalogenated silane containing an epoxy group, a triphenoxysilane containing an epoxy group, and a triacetoxysilane containing an epoxy group.

The silicon compounds containing an epoxy group can be used alone or in combination.

Of the ethylenic silicon compounds, preferably, a trialkoxysilane containing an epoxy group is used.

To be specific, examples of the trialkoxysilane containing an epoxy group include glycidoxyalkyltrimethoxysilane such as glycidoxymethyltrimethoxysilane, (2-glycidoxyethyl)trimethoxysilane, and (3-glycidoxypropyl)trimethoxysilane; (3-glycidoxypropyl)triethoxysilane; (3-glycidoxypropyl)tripropoxysilane; and (3-glycidoxypropyl)triisopropoxysilane.

Of the trialkoxysilanes containing an epoxy group, preferably, glycidoxymethyltrialkoxysilane is used, or more preferably, (3-glycidoxypropyl)trimethoxysilane is used.

The mixing ratio of the silicon compound containing an epoxy group with respect to 100 parts by mass of the condensation material is, for example, 0.01 to 90 parts by mass, preferably 0.01 to 50 parts by mass, or more preferably 0.01 to 1 parts by mass.

A commercially available product can be used as the silicon compound containing an epoxy group. A silicon compound containing an epoxy group synthesized in accordance with a known method can be also used.

The molar ratio (SiOH/(SiX$^1$+SiX$^2$)) of the silanol group (the SiOH group) in the polysiloxane containing silanol groups at both ends to the reactive functional group (the SiX$^1$ group and the SiX$^2$ group) in the ethylenic silicon compound and the silicon compound containing an epoxy group is, for example, 20/1 to 0.2/1, preferably 10/1 to 0.5/1, or more preferably substantially 1/1.

When the molar ratio exceeds the above-described upper limit, there may be a case where a product in a semi-cured state (a semi-cured product) having an appropriate toughness is not obtained when the first thermosetting silicone resin composition is brought into a semi-cured state. On the other hand, when the molar ratio is below the above-described lower limit, the mixing proportion of the ethylenic silicon compound and the silicon compound containing an epoxy group is excessively large, so that the heat resistance of the encapsulating resin layer to be obtained may be reduced.

When the molar ratio is within the above-described range (preferably, substantially 1/1), the silanol group (the SiOH group) in the polysiloxane containing silanol groups at both ends, and the reactive functional group (the SiX$^1$ group) in the ethylenic silicon compound and the reactive functional group (the SiX$^2$ group) in the silicon compound containing an epoxy group can be allowed to undergo the condensation reaction neither too much nor too little.

The molar ratio of the ethylenic silicon compound to the silicon compound containing an epoxy group is, for example, 10/90 to 99/1, preferably 50/50 to 97/3, or more preferably 80/20 to 95/5.

When the molar ratio is within the above-described range, there is an advantage that the adhesiveness of a cured product can be improved, while the strength thereof is ensured.

The organohydrogensiloxane is an organosiloxane having, in one molecule, at least two hydrosilyl groups without containing an ethylenically unsaturated hydrocarbon group.

To be specific, an example of the organohydrogensiloxane includes an organopolysiloxane containing hydrogen atoms in its side chain and an organopolysiloxane containing hydrogen atoms at both ends.

The organopolysiloxane containing hydrogen atoms in its side chain is an organohydrogensiloxane having hydrogen atoms as a side chain which branches off from the main chain. Examples thereof include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane.

The number average molecular weight of the organopolysiloxane containing hydrogen atoms in its side chain is, for example, 100 to 1000000.

The organopolysiloxane containing hydrogen atoms at both ends is an organohydrogensiloxane having hydrogen atoms at both ends of the main chain. Examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

The number average molecular weight of the organopolysiloxane containing hydrogen atoms at both ends is, for example, in view of stability and/or handling ability, 100 to 1000000, or preferably 100 to 100000.

The organohydrogensiloxanes can be used alone or in combination.

Of the organohydrogensiloxanes, preferably, an organopolysiloxane containing hydrogen atoms in its side chain is used, or more preferably, dimethylpolysiloxane-co-methylhydrogenpolysiloxane is used.

The viscosity of the organohydrogensiloxane at 25° C. is, for example, 10 to 100000 mPa·s, or preferably 20 to 50000 mPa·s. The viscosity is measured with a B-type viscometer.

The hydrosilyl group equivalent in the organohydrogensiloxane is, for example, 0.1 to 30 mmol/g, or preferably 1 to 20 mmol/g.

A commercially available product can be used as the organohydrogensiloxane. An organohydrogensiloxane synthesized in accordance with a known method can be also used.

The mixing ratio of the organohydrogensiloxane with respect to 100 parts by mass of the ethylenic silicon compound is, though depending on the molar ratio of the ethylenically unsaturated hydrocarbon group ($R^2$ in the above-described general formula (2)) in the ethylenic silicon compound to the hydrosilyl group (the SiH group) in the organohydrogensiloxane, for example, 10 to 10000 parts by mass, or preferably 100 to 1000 parts by mass.

The molar ratio ($R^2$/SiH) of the ethylenically unsaturated hydrocarbon group ($R^2$ in the above-described general formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can be also set to be, for example, less than 1/1 and not less than 0.05/1.

When the molar ratio exceeds 20/1, there may be a case where a semi-cured product having an appropriate toughness is not obtained when the first thermosetting silicone resin composition is brought into a semi-cured state. On the other hand, when the molar ratio is below 0.05/1, the mixing proportion of the organohydrogensiloxane is excessively large, so that the heat resistance and the toughness of the encapsulating resin layer to be obtained may be insufficient.

When the molar ratio is less than 1/1 and not less than 0.05/1, in allowing the first thermosetting silicone resin composition to be brought into a semi-cured state, the first thermosetting silicone resin composition can be quickly transferred into a semi-cured state, compared to the first thermosetting silicone resin composition whose molar ratio is 20/1 to 1/1.

The above-described polysiloxane containing silanol groups at both ends, ethylenic silicon compound, silicon compound containing an epoxy group, and organohydrogensiloxane are blended with a catalyst to be stirred and mixed, so that the first thermosetting silicone resin composition is prepared.

Examples of the catalyst include a condensation catalyst and an addition catalyst (a hydrosilylation catalyst).

The condensation catalyst is not particularly limited as long as it is a substance capable of improving the reaction rate of the condensation reaction of the silanol group with the reactive functional group (the $SiX^1$ group in the above-described general formula (2) and the $SiX^2$ group in the above-described general formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

The condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.5 to 5 mol.

The addition catalyst is not particularly limited as long as it is a substance capable of improving the reaction rate of the addition reaction, that is, the hydrosilylation reaction of the ethylenically unsaturated hydrocarbon group with the SiH. An example of the addition catalyst includes a metal catalyst such as a platinum catalyst including platinum black, platinum chloride, chloroplatinic acid, a platinum olefin complex, a platinum carbonyl complex, and platinum acetyl acetate; a palladium catalyst; and a rhodium catalyst.

The addition catalysts can be used alone or in combination.

Of the addition catalysts, in view of compatibility, transparency, and catalyst activity, preferably, a platinum catalyst is used, or more preferably, a platinum carbonyl complex is used.

The mixing ratio of the addition catalyst with respect to 100 parts by mass of the organohydrogensiloxane is, as the number of parts by mass of the metal amount in the addition catalyst, for example, $1.0 \times 10^{-4}$ to 1.0 parts by mass, preferably $1.0 \times 10^4$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst dissolved or dispersed in a solvent can be used as a solution or a dispersion liquid.

Examples of the solvent include water and an alcohol such as methanol and ethanol. Preferably, an alcohol is used.

In order to prepare the first thermosetting silicone resin composition, for example, the above-described materials (the condensation materials and the addition materials) and the catalysts can be added simultaneously. Alternatively, each of the materials and each of the catalysts can be added, respectively, at different timings. Furthermore, a part of the components can be added simultaneously and each of the remaining components can be added, respectively, at different timings.

Of the preparing methods of the first thermosetting silicone resin composition, preferably, the following method is used. The condensation materials and the condensation catalyst are first added simultaneously. Next, the addition material is added thereto and then, the addition catalyst is added thereto.

To be specific, the polysiloxane containing silanol groups at both ends, the ethylenic silicon compound, and the silicon compound containing an epoxy group (that is, the condensation materials) are simultaneously blended with the condensation catalyst at the above-described proportion to be stirred for, for example, 5 minutes to 24 hours.

At the time of blending and stirring, the temperature can be also adjusted to, for example, 0 to 60° C., or preferably 10 to 35° C. so as to improve the compatibility and the handling ability of the condensation materials.

At the time of blending of the materials and the condensation catalyst, a compatibilizing agent for improving the compatibility thereof can be added at an appropriate proportion.

An example of the compatibilizing agent includes an organic solvent such as an alcohol including methanol. When the condensation catalyst is prepared as a solution or a dispersion liquid of the organic solvent, the organic solvent can serve as the compatibilizing agent.

Thereafter, the pressure in the system (the above-described mixture) is reduced as required, so that a volatile component (the organic solvent) is removed.

Next, the organohydrogensiloxane is blended into the obtained mixture of the condensation materials and the condensation catalyst to be stirred for, for example, 1 to 120 minutes.

At the time of blending and stirring, the temperature can be also adjusted to, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the first thermosetting silicone resin composition can be prepared.

The prepared first thermosetting silicone resin composition is, for example, in a liquid state (in an oil state).

The viscosity of the first thermosetting silicone resin composition at 25° C. is, for example, 1000 to 20000 mPa·s, or preferably 4000 to 10000 mPa·s. The viscosity is measured with a B-type viscometer.

The above-described condensation/addition reaction curable type silicone resin composition is, for example, in a liquid state (in an oil state). As described later, after the condensation/addition reaction curable type silicone resin composition is applied onto a release sheet, the condensation materials are allowed to undergo the condensation reaction by heating, so that the condensation/addition reaction curable type silicone resin composition is prepared. As described later, after an encapsulating resin layer made from the condensation/addition reaction curable type silicone resin composition embeds a light emitting diode, the addition material is allowed to undergo the addition reaction by further heating, so that an encapsulating layer after curing is formed.

To be specific, the first thermosetting silicone resin composition contains, for example, a polydimethylsiloxane containing silanol groups at both ends, vinyltrimethoxysilane, (3-glycidoxypropyl)trimethoxysilane, and dimethylpolysiloxane-co-methylhydrogenpolysiloxane. The second thermosetting silicone resin composition contains, for example, a dimethylvinylsilyl-terminated polydimethylsiloxane, a trimethylsilyl-terminated dimethylsiloxane-methylhydrosiloxane copolymer, a platinum-divinyltetramethyldisiloxane complex, and tetramethylammonium hydroxide. The third thermosetting silicone resin composition contains, for example, a hydrogen-terminated vinylmethylsiloxane-dimethylsiloxane copolymer, a trimethylsiloxy-terminated dimethylsiloxane-methylhydrosiloxane copolymer, a platinum-carbonyl complex, and tetramethylammonium hydroxide. The fourth thermosetting silicone resin composition contains, for example, a hydroxy group-terminated vinylmethylsiloxane-dimethylsiloxane copolymer, a trimethylsiloxy-terminated dimethylsiloxane-methylhydrosiloxane copolymer, a platinum-carbonyl complex, and tetramethylammonium hydroxide.

Examples of microparticles include organic microparticles such as silicone microparticles and inorganic microparticles such as silica microparticles, talc microparticles, alumina microparticles, aluminum nitride microparticles, and silicon nitride microparticles. An example of the inorganic microparticles can also include phosphor microparticles.

The same type of the microparticles can be used alone or different types of the microparticles can be used in combination.

As the microparticles, in view of heat resistance, preferably, inorganic microparticles are used. Also, in view of optical characteristics of having a similar refractive index as that of the thermosetting silicone resin, silica microparticles and silicone microparticles are used and in view of transparency, silicone microparticles are used.

The silicone microparticles are microparticles of a polysiloxane (after curing) having a cross-linked structure. An example thereof includes polysilsesquioxane microparticles. In view of hardness (reinforcing effect of the encapsulating layer), preferably, polymethylsilsesquioxane microparticles are used.

The refractive index of the silicone microparticles is similar to that of the thermosetting silicone resin. To be specific, the refractive index of the silicone microparticles is, for example, 1.39 to 1.44. The difference between the refractive index of the silicone microparticles and that of the thermosetting silicone resin is, for example, within 0.02 in absolute value.

Examples of the silica microparticles include fused silica microparticles and crystalline silica microparticles. Preferably, fused silica microparticles (that is, silica glass microparticles) are used.

The phosphor microparticles are microparticles having a wavelength conversion function. An example of the phosphor microparticles includes known phosphor microparticles such as yellow phosphor microparticles which are capable of converting blue light into yellow light and red phosphor microparticles which are capable of converting the blue light into red light.

Examples of the yellow phosphor microparticles include garnet type phosphor microparticles having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and oxynitride phosphor microparticles such as Ca-α-SiAlON.

An example of the red phosphor microparticles includes nitride phosphor microparticles such as $CaAlSiN_3$:Eu and $CaSiN_2$:Eu.

Examples of the shape of each of the microparticles include a sphere shape, a plate shape, and a needle shape. Preferably, in view of fluidity, a sphere shape is used.

The average value of the maximum length (in the case of a sphere shape, the average particle size) of each of the microparticles is, for example, 0.1 to 100 μm, in view of optical characteristics and handling ability, preferably 1 to 50 μm, or more preferably 2 to 30 μm. The average value of the maximum length is measured using a laser diffraction scattering particle size analyzer.

The mixing ratio of the microparticles with respect to the thermosetting silicone resin is adjusted, for example, so as to be 1 to 80 mass %, or preferably, in view of maintaining fluidity, to be 10 to 50 mass %.

The mixing ratio of the microparticles with respect to the resin composition is, for example, 10 to 60 mass %, or preferably 15 to 40 mass %.

A known additive can be added to the above-described resin composition at an appropriate proportion as required. Examples of the known additive include silane coupling agents, antioxidants, modifiers, surfactants, dyes, pigments, discoloration inhibitors, and ultraviolet absorbers.

In order to prepare the resin composition, the thermosetting silicone resin, the microparticles, and the additive as required, are blended at the above-described mixing proportion to be mixed.

The mixing conditions are as follows: a temperature of, for example, 10 to 40° C., or preferably 15 to 35° C. and a duration of, for example, 10 minutes or more, or preferably 30 minutes or more.

The resin composition is subjected to a defoaming process as required after the preparation thereof.

An example of the defoaming method includes a known defoaming method such as reduced pressure defoaming (vacuum defoaming), centrifugal defoaming, and ultrasonic defoaming. Preferably, reduced pressure defoaming (vacuum defoaming) is used.

When the defoaming method is the reduced pressure defoaming (vacuum defoaming), the defoaming conditions are as follows: a temperature of, for example, 10 to 40° C., or preferably 15 to 35° C. and a duration of, for example, 10 minutes or more, or preferably 30 minutes or more.

The viscosity of the resin composition at 25° C. is, for example, 1000 to 100000 mPa·s, or preferably 5000 to 50000 mPa·s.

When the viscosity of the resin composition is below the above-described lower limit, the formability or the processability may be insufficient.

Preferably, as described later, the encapsulating resin layer (that is, a silicone resin sheet) is formed from a resin composition in a semi-cured state (in a B-stage state).

The refractive index of the encapsulating resin layer is, for example, 1.38 to 1.46, or preferably 1.39 to 1.44.

The complex viscosity of the encapsulating resin layer in a semi-cured state at a frequency of 10 Hz obtained by a dynamic viscoelastic measurement at a frequency of 0.1 to 50 Hz at 30° C.; a rate of frequency increase of 10 Hz/min; and a distortion of 1% in a shear mode is 80 to 1000 Pa·s, preferably 100 to 500 Pa·s, or more preferably 150 to 250 Pa·s.

When the complex viscosity exceeds the above-described range, the encapsulating characteristics are reduced. On the other hand, when the complex viscosity is below the above-described range, the handling ability of the silicone resin sheet is reduced.

The tan δ of the encapsulating resin layer in a semi-cured state at a frequency of 10 Hz obtained by a dynamic viscoelastic measurement at a frequency of 0.1 to 50 Hz at 30° C.; a rate of frequency increase of 10 Hz/min; and a distortion of 1% in a shear mode is 0.3 to 1.6, or preferably 0.3 to 1.4.

When the tan δ exceeds the above-described range, a wire is damaged when the light emitting diode element connected to a board by a wire bonding method is embedded.

On the other hand, when the tan δ is below the above-described range, the handling ability is reduced.

The compressive elastic modulus (at 25° C.) of the encapsulating resin layer is, in view of encapsulating characteristics and handling ability, for example, 0.01 to 1 MPa, or preferably 0.01 to 0.5 MPa.

When the compressive elastic modulus of the encapsulating resin layer is below the above-described range, there may be a case where the shape retention of the encapsulating resin layer is reduced. On the other hand, when the compressive elastic modulus of the encapsulating resin layer exceeds the above-described range, a wire is damaged when the light emitting diode element connected to a board by a wire bonding method is embedded.

The compressive elastic modulus of the encapsulating resin layer can be obtained by a compression test using a precision load measuring device.

The thickness of the encapsulating resin layer is not particularly limited and is appropriately adjusted so that the light emitting diode and the wire can be embedded at the time of encapsulating the light emitting diode to be described later.

The thickness of the encapsulating resin layer is, for example, 300 to 3000 μm, or preferably 500 to 2000 μm.

When the thickness of the encapsulating resin layer is below the above-described range, the encapsulation of the light emitting diode may be insufficient.

The encapsulating resin layer can be formed of a single layer or a plurality of layers.

FIG. 1 shows process drawings for illustrating the steps of producing one embodiment of a silicone resin sheet of the present invention.

Next, a method for producing a silicone resin sheet 1 is described with reference to FIG. 1.

In this method, first, as shown in FIG. 1 (a), a release sheet 5 is prepared.

The release sheet 5 is used as a protecting sheet which covers and protects the top surface of an encapsulating resin layer 7 and as a coating substrate of the encapsulating resin layer 7.

Examples of the release sheet 5, though not particularly limited, include a polyester film such as a polyethylene terephthalate (PET) film; a polycarbonate film; a polyolefin film such as a polyethylene film and a polypropylene film; a polystyrene film; an acrylic film; and a resin film such as a silicone resin film and a fluorine resin film.

Of the release sheets 5, preferably, a polyester film is used.

A release treatment is performed on the top surface (the surface at the side where the encapsulating resin layer 7 is to be formed) of the release sheet 5 as required so as to increase the release characteristics from the encapsulating resin layer 7.

The thickness of the release sheet 5 is not particularly limited and is, for example, in view of handling ability and cost, 20 to 100 μm, or preferably 30 to 80 μm.

Next, as shown in FIG. 1 (b), the encapsulating resin layer 7 is laminated on the upper surface of the release sheet 5.

In order to laminate the encapsulating resin layer 7 on the release sheet 5, for example, the resin composition is applied to the entire upper surface of the release sheet 5 by a known application method such as a casting, a spin coating, and a roll coating, so that the encapsulating resin layer 7 is formed.

The encapsulating resin layer 7 is heated, so that the encapsulating resin layer 7 made from the resin composition is semi-cured.

In this way, the thermosetting silicone resin is brought into a semi-cured state. To be specific, the heating conditions are the conditions in which a condensation reaction (a silanol condensation reaction) is progressed when the thermosetting silicone resin is a condensation/addition reaction curable type silicone resin composition.

The heating conditions of the semi-curing are as follows: a temperature of, for example, 80 to 200° C., preferably 120 to 160° C., or more preferably 130 to 140° C. and a heating duration of, for example, 0.5 to 100 minutes, preferably 1 to 20 minutes, or more preferably 3 to 10 minutes.

In this way, the encapsulating resin layer 7 is laminated on the upper surface of the release sheet 5.

As described above, the silicone resin sheet 1 is prepared.

The size of the silicone resin sheet 1 is not particularly limited as long as the silicone resin sheet 1 is capable of encapsulating the light emitting diode (described later) and the wire (described later). The size of the silicone resin sheet 1 is larger by, for example, 1 to 20 mm, or preferably 2 to 10 mm than the outer circumference line of the projected surface in the up-down direction of the light emitting diode and the wire (described later).

FIG. 2 shows process drawings for illustrating the steps of embedding a light emitting diode element by the silicone resin sheet shown in FIG. 1 to fabricate a light emitting diode device by encapsulating the light emitting diode element by a cured sheet.

Next, a method for producing a light emitting diode device 2 by encapsulating a light emitting diode element 11 using the silicone resin sheet 1 in FIG. 1 is described with reference to FIG. 2.

In this method, first, as shown in FIG. 2 (a), the silicone resin sheet 1 and a board 14 are prepared.

The board 14 is formed of, for example, a metal board made of aluminum or the like or, for example, a resin board made of a polyimide resin or the like. The board 14 is formed into a generally flat plate shape which is larger than the encapsulating resin layer 7 in the silicone resin sheet 1.

The board 14 is provided with a terminal (not shown) formed on the upper surface thereof, the light emitting diode element 11 mounted on the central portion thereof, and a wire 12 for electrically connecting the light emitting diode element 11 to the terminal (not shown). The upper surface of the light emitting diode element 11 is wire bonded to the upper surface of the board 14 via the wire 12.

The wire 12 is formed of a conductive material such as gold, silver, or copper.

The wire 12 is formed into a curved shape in side view and the size thereof is appropriately selected. The wire diameter thereof is, for example, 10 to 100 μm. The length in the up-down direction between the element-side contact point of the wire 12 on the upper surface of the light emitting diode element 11 and the most upper portion of the wire 12 is, for example, 150 to 250 μm. The length in the up-down direction between the board-side contact point of the wire 12 on the upper surface of the board 14 and the most upper portion of the wire 12 is, for example, 300 to 450 μm. The length in the plane direction (the length in the right-left direction in FIG. 2 (a)) between the element-side contact point and the board-side contact point is, for example, 1400 to 1600 μm.

The light emitting diode element 11 is, for example, an optical semiconductor element capable of emitting the blue light and is formed into a generally rectangular shape in sectional view.

The light emitting diode element 11 is formed into a generally rectangular flat plate shape in plane view. The length of the side thereof is, for example, 0.1 to 5 mm and the thickness thereof is, for example, 10 to 1000 μm.

The silicone resin sheet 1 in a state shown in FIG. 1 (b) is reversed up-side down and the reversed silicone resin sheet 1 is disposed so that the encapsulating resin layer 7 is opposed to the light emitting diode element 11 at spaced intervals thereto in the up-down direction.

Next, as shown in FIGS. 2 (*b*) and 2 (*c*), the light emitting diode element 11 is embedded by the silicone resin sheet 1.

To be specific, as shown in FIG. 2 (*b*), the silicone resin sheet 1 is lowered (pressed downwardly) and the surfaces of the light emitting diode element 11 and the wire 12 are covered with the encapsulating resin layer 7. Subsequently, as shown in FIG. 2 (*c*), the silicone resin sheet 1 is compressively bonded to the board 14.

The compressive bonding is performed by controlling the amount (hereinafter, defined as a pushed-in amount) in which the encapsulating resin layer 7 is pushed into (compressed into) the board 14 side.

The pushed-in amount is represented by the following formula.

Pushed-in amount=Thickness $L1$ of the encapsulating resin layer 7 before the compression(the compressive bonding)−Thickness $L2$ of the encapsulating resin layer 7 after the compression(the compressive bonding)

The pushed-in amount is adjusted so that the pushed-in rate represented by the following formula is set to be, for example, 5 to 30%.

Pushed-in rate=Pushed-in amount/Thickness $L1$ of the encapsulating resin layer 7 before the compression(the compressive bonding)×100%

To be specific, the silicone resin sheet 1 is compressively bonded so that the thickness of the encapsulating resin layer 7 is compressed by the pushed-in amount.

By adjusting the pushed-in amount in this way, a collapse of the silicone resin sheet 1 is prevented, so that the light emitting diode element 11 can be surely encapsulated by the silicone resin sheet 1.

In the compressive bonding, the silicone resin sheet 1 can be retained in a state where it is pressed downwardly (pushed in) and the retention duration thereof is, for example, 10 seconds to 10 minutes, or preferably 10 seconds to 5 minutes.

The temperature of the compressive bonding is, for example, 0 to 40° C., or preferably 15 to 35° C.

Next, as shown in FIG. 2 (*d*), the silicone resin sheet 1 and the board 14 are heated.

By the heating, the encapsulating resin layer 7 is cured in the silicone resin sheet 1.

To be more specific, the resin composition in a semi-cured state (in a B-stage state) is brought into a completely cured state (into a C-stage state). To be specific, the heating conditions are the conditions in which an addition reaction (a hydrosilylation addition reaction) is progressed when the thermosetting silicone resin is a condensation/addition reaction curable type silicone resin composition.

To be specific, the heating temperature is, for example, 80 to 200° C., or preferably 100 to 180° C. and the heating duration is, for example, 1 to 20 hours, or preferably 2 to 10 hours.

In this way, the silicone resin sheet 1 including the encapsulating resin layer 7 is brought into a cured sheet 20 including an encapsulating layer 10 which is formed by curing the encapsulating resin layer 7.

Thereafter, as shown in phantom lines in FIG. 2 (*d*), the release sheet 5 is peeled from the encapsulating layer 10.

As described above, the light emitting diode device 2 in which the light emitting diode element 11 is encapsulated by the encapsulating layer 10 in the cured sheet 20 is fabricated.

That is, the light emitting diode device 2 which is provided with the light emitting diode element 11 and the encapsulating layer 10 for encapsulating the light emitting diode element 11 is fabricated.

In the method for producing the light emitting diode device 2, the silicone resin sheet 1 having the complex viscosity at a frequency of 10 Hz at 30° C. of 80 to 1000 Pa·s and having the tan δ at a frequency of 10 Hz at 30° C. of 0.3 to 1.6 is used, so that the silicone resin sheet 1 has an excellent handling ability at a temperature close to room temperature (to be specific, 15 to 35° C.) and as shown in FIG. 2 (*b*), is capable of embedding the light emitting diode element 11, while preventing a damage of the light emitting diode element 11 and the wire 12 at a temperature close to room temperature.

As shown in FIG. 2 (*c*), the light emitting diode element 11 is encapsulated by the encapsulating layer 10 in the cured sheet 20 obtained by curing the encapsulating resin layer 7 in the silicone resin sheet 1, so that the light emitting diode device 2 of the present invention having an excellent reliability can be obtained.

EXAMPLES

While the present invention will be described hereinafter in further detail with reference to Prepared Example, Examples, and Comparative Examples, the present invention is not limited to these Prepared Example, Examples, and Comparative Examples.

Prepared Example 1

Preparation of Condensation/Addition Reaction Curable Type Silicone Resin Composition 15.71 g (0.106 mol) of a vinyltrimethoxysilane (an ethylenic silicon compound) and 2.80 g (0.0118 mol) of a (3-glycidoxypropyl)trimethoxysilane (a silicon compound containing an epoxy group) were blended into 2031 g (0.177 mol) of a polydimethylsiloxane containing silanol groups at both ends (a polysiloxane containing silanol groups at both ends, in general formula (1), all of $R^1$s are methyl, the average of "n" is 155, a number average molecular weight of 11500, a silanol group equivalent of 0.174 mmol/g) and the obtained mixture was stirred and mixed.

The molar ratio (the number of moles of SiOH group/the total number of moles of $SiOCH_3$ group) of the SiOH group in the polydimethylsiloxane containing silanol groups at both ends to the $SiOCH_3$ group in the vinyltrimethoxysilane and the (3-glycidoxypropyl)trimethoxysilane was 1/1.

After the stirring and mixing, 0.97 mL (0.766 g, a catalyst content: 0.88 mmol, corresponding to 0.50 mol with respect to 100 mol of the polydimethylsiloxane containing silanol groups at both ends) of a methanol solution of tetramethylammonium hydroxide (a condensation catalyst, a concentration of 10 mass %) was added to the obtained mixture to be stirred at 40° C. for 1 hour. Thereafter, the obtained mixture was stirred under a reduced pressure (10 mmHg) at 40° C. for 1 hour and a volatile component (methanol or the like) was removed.

Thereafter, the pressure in the system was brought back to the normal pressure and then, 44.5 g (0.022 mol) of an organohydrogensiloxane (manufactured by Shin-Etsu Chemical Co., Ltd., a dimethylpolysiloxane-co-methylhydrogenpolysiloxane, an average molecular weight of 2000, a hydrosilyl group equivalent of 7.14 mmol/g) was added to the reactant to be stirred at 40° C. for 1 hour.

The molar ratio ($CH_2$=CH—/SiH) of the vinyl group ($CH_2$=CH—) in the vinyltrimethoxysilane to the hydrosilyl group (SiH group) in the organohydrogensiloxane was 1/3.

Thereafter, 0.13 g (0.13 mL, a platinum content of 2 mass %, as a platinum, corresponding to $5.8 \times 10^{-3}$ parts by mass with respect to 100 parts by mass of the organohydrogensiloxane) of a siloxane solution of a platinum carbonyl complex (an addition catalyst, a platinum concentration of 2 mass %) was added to the system to be stirred at 40° C. for 10 minutes, so that a thermosetting silicone resin composition (a condensation/addition reaction curable type) was obtained.

Example 1

Preparation of Resin Composition 20 mass % of Tospearl 2000B (trade name, polymethylsilsesquioxane microparticles, an average particle size of 6.0 μm, the refractive index of 1.41, manufactured by Momentive Performance Materials Inc.) was blended in the thermosetting silicone resin composition to be stirred at room temperature (at 25° C.) for 10 minutes. After the stirring, the obtained mixture was subjected to a defoaming process under a reduced pressure with a vacuum dryer at room temperature for 30 minutes or more.

In this way, a resin composition was prepared. The refractive index of the resin composition was 1.42.

<Fabrication of Silicone Resin Sheet>

The resin composition was applied to the upper surface of a release sheet (ref: FIG. 1 (a)) made of a polyester film (trade name: SS4C, manufactured by Nippa CO., LTD., a thickness of 50 μm) so as to have a thickness of 600 μm to be thereafter heated at 135° C. for 9 minutes, so that a silicone resin sheet in which an encapsulating resin layer in a semi-cured state having a thickness of 600 μm was laminated on the upper surface of the release sheet was fabricated.

<Fabrication of Light Emitting Diode Device>

A board to which a light emitting diode element having a size of 1 mm×1 mm and a thickness of 100 μm in a rectangular shape in plane view was connected by a wire bonding method was prepared.

A wire was made of gold and the wire diameter thereof was 30 μm. The wire was formed into a curved shape. The size thereof was as follows: a length in the up-down direction between the element-side contact point and the most upper portion of the wire of 300 μm; a length in the up-down direction between the board-side contact point and the most upper portion of the wire of 450 μm; and a length in the right-left direction between the element-side contact point and the board-side contact point of 1500 μm.

Thereafter, the silicone resin sheet was cut into a rectangular shape in plane view having a size of 10 mm×10 mm. Then, the light emitting diode element was embedded by the silicone resin sheet at normal temperature (at 25° C.) (ref: FIGS. 2 (b) and 2 (c)).

To be specific, the silicone resin sheet was lowered and the surfaces of the light emitting diode element and the wire were covered with the encapsulating resin layer (ref: FIG. 2 (b)). Subsequently, the position of the silicone resin sheet was retained at 25° C. for 40 seconds in a state where the thickness of the encapsulating resin layer was controlled so as to be compressed by the pushed-in amount of 100 μm (pushed-in rate of 16.7%=pushed-in amount of 100 μm/thickness of the encapsulating resin layer before the compression (the compressive bonding) of 600 μm×100%), so that the silicone resin sheet was compressively bonded to an aluminum core board (ref: FIG. 2 (c)).

Thereafter, the silicone resin sheet and the board were heated at 150° C., so that the encapsulating resin layer was cured to serve as an encapsulating layer. The light emitting diode element was encapsulated by the obtained encapsulating layer. In this way, a light emitting diode device was fabricated (ref: FIG. 2 (d)).

Examples 2 to 6 and Comparative Examples 1 to 4

A resin composition was prepared and subsequently, a silicone resin sheet and a light emitting diode device were fabricated in the same manner as in Example 1, except that the mixing formulation and the heating conditions were changed in conformity with Table 1.

<Evaluation>

The following of the silicone resin sheets and the light emitting diode devices in Examples and Comparative Examples was evaluated. The results are shown in Table 1.

(1) Dynamic Viscoelastic Measurement (Complex Viscosity and Tan δ)

The dynamic viscoelastic measurement was performed on the silicone resin sheet.

To be specific, a rheometer provided with two circular plates each having a diameter of 25 mm and being disposed in opposed relation to each other in the up-down direction was used.

To be specific, the lower surface of the encapsulating resin layer in the silicone resin sheet which includes the encapsulating resin layer in a B-stage state was disposed in a circular plate at the lower side. Thereafter, the release sheet was peeled from the encapsulating resin layer and then, a circular plate at the upper side was brought into contact with the upper surface of the encapsulating resin layer. In this way, the encapsulating resin layer was sandwiched between two circular plates.

Thereafter, the complex viscosity and the tan δ of the encapsulating resin layer at a frequency of 10 Hz were obtained by conducting a dynamic viscoelastic measurement at a frequency of 0.1 to 50 Hz at 30° C.; a rate of frequency increase of 10 Hz/min; and a distortion of 1% in a shear mode.

(2) Processability

The processability was evaluated from the above-described (1) Dynamic Viscoelastic Measurement (Complex Viscosity and Tan δ) in accordance with the following evaluation criteria.

Bad: the complex viscosity was below 80 Pa·s or the tan δ exceeded 1.6. In such a state, the fluidity was high and the sheet shape could not be retained. That is, the shape retention was defective.

Good: the complex viscosity was 80 Pa·s or more and the tan δ was 1.6 or less. In such a state, the processability and the handling ability of the sheet were good.

(3) Encapsulating Characteristics

The shape of the wire before and after the encapsulation by the cured sheet was observed with an X-ray observation device and was evaluated in accordance with the following criteria.

Good: the deformation of the wire was not confirmed.

Poor: the deformation of the wire was slightly confirmed, but there was no problem in the emission of light of the light emitting diode element.

Bad: the deformation of the wire was confirmed and there was a problem in the emission of light of the light emitting diode element.

TABLE 1

|  |  | Ex. 1 | Ex. 2 | Ex. 3 | Ex. 4 | Ex. 5 | Ex. 6 | Comp. Ex. 1 | Comp. Ex. 2 | Comp. Ex. 3 | Comp. Ex. 4 |
|---|---|---|---|---|---|---|---|---|---|---|---|
| Microparticles [Mass % vs Thermosetting Silicone Resin Composition] | Silicone Microparticles | 10 | 30 | 50 | — | — | 30 | 75 | 75 | 5 | 5 |
|  | Silica Microparticles 1 | — | — | — | 50 | — | — | — | — | — | — |
|  | Silica Microparticles 2 | — | — | — | — | 50 | — | — | — | — | — |
| Heating Conditions (Semi-curing Conditions) | Temperature [° C.] | 135 | 135 | 135 | 135 | 135 | 135 | 135 | 135 | 135 | 135 |
|  | Duration [Min] | 9 | 9 | 9 | 4 | 5 | 6 | 2 | 5 | 17 | 6 |
| Dynamic Viscoelasticity [at 30° C.] | Complex Viscosity [Pa·s] | 240 | 170 | 520 | 160 | 240 | 240 | 290 | 1260 | 300 | 60 |
|  | Tan δ | 0.60 | 1.35 | 1.16 | 1.38 | 0.99 | 0.85 | 1.75 | 0.73 | 0.27 | 1.37 |
| Sheet Processability |  | Good | Good | Good | Good | Good | Good | Bad | Good | Good | Bad |
| Sheet Encapsulating Characteristics |  | Poor | Good | Poor | Good | Poor | Good | — | Bad | Bad | — |

The details of each of the components in Table 1 are given below.

Silicone microparticles: trade name "Tospearl 2000B", polymethylsilsesquioxane microparticles, an average particle size of 6.0 μm, the refractive index of 1.41, manufactured by Momentive Performance Materials Inc.

Silica microparticles 1: trade name "FB-7SDC", fused silica microparticles, an average particle size of 7 μm, manufactured by DENKI KAGAKU KOGYO KABUSHIKI KAISHA Silica microparticles 2: trade name "FB-40S", fused silica microparticles, an average particle size of 40 μm, manufactured by DENKI KAGAKU KOGYO KABUSHIKI KAISHA While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A silicone resin sheet formed from:
a resin composition containing a thermosetting silicone resin and microparticles, wherein
the silicone resin sheet is in a semi-cured state and has a thickness of 300 to 3,000 μm, and
the complex viscosity of the silicone resin sheet at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C. while increasing the frequency by 10 Hz per minute; and a distortion of 1% in a shear mode.

2. The silicone resin sheet according to claim 1, wherein the microparticles are silica microparticles and/or silicone microparticles.

3. A cured sheet obtained by curing a silicone resin sheet, wherein the silicone resin sheet is in a semi-cured state and has a thickness of 300 to 3,000 μm, and
the silicone resin sheet is formed from:
a resin composition containing a thermosetting silicone resin and microparticles, and
the complex viscosity of the silicone resin sheet at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C. while increasing the frequency by 10 Hz per minute; and a distortion of 1% in a shear mode.

4. A light emitting diode device comprising:
a light emitting diode element and
a cured sheet which encapsulates the light emitting diode element, wherein
the cured sheet is obtained by curing a silicone resin sheet,
the silicone resin sheet is in a semi-cured state and has a thickness of 300 to 3,000 μm, and
the silicone resin sheet is formed from:
a resin composition containing a thermosetting silicone resin and microparticles, and
the complex viscosity of the silicone resin sheet at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C. while increasing the frequency by 10 Hz per minute; and a distortion of 1% in a shear mode.

5. A method for producing a light emitting diode device comprising the steps of:
embedding a light emitting diode element by a silicone resin sheet, wherein the silicone resin sheet is in a semi-cured state and has a thickness of 300 to 3,000 μm, and
encapsulating the light emitting diode element by curing the silicone resin sheet, and
the silicone resin sheet is formed from:
a resin composition containing a thermosetting silicone resin and microparticles, and
the complex viscosity of the silicone resin sheet at a frequency of 10 Hz is 80 to 1000 Pa·s and the tan δ thereof at a frequency of 10 Hz is 0.3 to 1.6 obtained by a dynamic viscoelastic measurement at a frequency of 0.1 to 50 Hz at 30° C. while increasing the frequency by 10 Hz per minute; and a distortion of 1% in a shear mode.

6. A light emitting diode encapsulating material comprising:
a release sheet; and
an encapsulating resin layer comprising the silicone resin sheet according to claim 1,
wherein the encapsulating resin layer is disposed on an upper surface of the release sheet.

* * * * *